United States Patent
Chirania et al.

(10) Patent No.: US 7,600,204 B1
(45) Date of Patent: Oct. 6, 2009

(54) METHOD FOR SIMULATION OF NEGATIVE BIAS AND TEMPERATURE INSTABILITY

(75) Inventors: Manoj Chirania, Palo Alto, CA (US); Philip D. Costello, Saratoga, CA (US); Robert I-Che Fu, Saratoga, CA (US)

(73) Assignee: Xilinx, Inc., San Jose, CA (US)

( * ) Notice: Subject to any disclaimer, the term of this patent is extended or adjusted under 35 U.S.C. 154(b) by 315 days.

(21) Appl. No.: 11/706,744

(22) Filed: Feb. 14, 2007

(51) Int. Cl.
*G06F 17/50* (2006.01)

(52) U.S. Cl. .............................. 716/4; 716/1

(58) Field of Classification Search ............. 716/1, 716/4
See application file for complete search history.

(56) References Cited

U.S. PATENT DOCUMENTS

| | | | | |
|---|---|---|---|---|
| 6,321,363 | B1 * | 11/2001 | Huang et al. | 716/4 |
| 2003/0233624 | A1 * | 12/2003 | Reddy et al. | 716/4 |
| 2005/0138581 | A1 * | 6/2005 | Usui | 716/4 |
| 2006/0190859 | A1 * | 8/2006 | Cui et al. | 716/4 |
| 2006/0282804 | A1 * | 12/2006 | Ang et al. | 716/4 |

* cited by examiner

*Primary Examiner*—Stacy A Whitmore
*Assistant Examiner*—Magid Y Dimyan
(74) *Attorney, Agent, or Firm*—Michael T. Wallace; Thomas George

(57) ABSTRACT

An apparatus and method to accurately simulate negative bias and temperature instability (NBTI) and its effect. According to a first simulation method, a simulation netlist is automatically scanned for any P-type devices that are in a conductive state after application of an initial condition. Each conductive P-type device is automatically replaced with an NBTI device model and a first simulation cycle is executed. After the first cycle, each conductive P-type device is again replaced with an NBTI model and a second simulation cycle is executed. In a second simulation method, only those P-type devices transitioning from a non-conductive state to a conductive state are automatically replaced with an NBTI model prior to each half cycle of the second simulation method. The first simulation method provides robustness, while the second simulation method provides worst case verification in less time as compared to the first simulation method.

11 Claims, 4 Drawing Sheets

METHOD FOR SIMULATION OF NEGATIVE BIAS AND TEMPERATURE INSTABILITY

FIELD OF THE INVENTION

The present invention generally relates to circuit simulations, and more particularly, to the simulation of the negative bias and temperature instability (NBTI) phenomenon on deep, sub-micron circuits.

BACKGROUND

Recent advances in the field of semiconductor integrated circuits have brought about higher levels of integration. Semiconductor manufacturing process advancements are driving the corresponding geometric dimensions for semiconductor devices to decreasingly smaller values. As semiconductor manufacturing processes advance, so must the corresponding simulation algorithms that are used to characterize the circuits manufactured by the advanced processes.

Semiconductor devices implemented using 130 nm process rules, for example, behave differently when those devices are implemented with sub-100 nm, e.g., 90 nm or 65 nm, process rules. In particular, negative bias and temperature instability (NBTI) is one example of a device degradation mechanism that has been identified with sub-100 nm metal oxide semiconductor field effect transistors (MOSFETs).

NBTI causes a threshold voltage increase in P-type MOSFETs (PMOSFETs), which results in a degraded transistor current drive. Such a degradation in current drive also affects the switching speed of circuits that incorporate NBTI-affected PMOS devices. The amount of time required to switch the output of an inverter, for example, from a logic high level to a logic low level actually decreases due to the degraded current drive of the NBTI affected PMOSFET within the inverter. Conversely, the amount of time required to switch the output of the inverter from a logic low level to a logic high level increases due to the degraded current drive of the NBTI affected PMOS transistor within the inverter.

NBTI effects become prevalent when the gate of a PMOS device is negatively biased for an extended period of time, e.g., several years, at elevated temperatures. In such instances, interface traps and fixed charges are created, whereby the silicon oxide of the PMOS gate interacts with the crystal lattice of the silicon substrate to trap holes, i.e., positive charge, within the channel inversion layer. The fixed charges and interface traps are of the same polarity, i.e., positive, and combine to increase the threshold voltage, $V_T$, of the PMOS device.

Due to the NBTI phenomenon, therefore, designers must consider the bias conditions of each PMOS transistor throughout the PMOS transistor's lifetime. Typically, consideration of the bias conditions must allow for at least 10 years of operation in a conductive state at high temperature. In a particular simulation scenario, therefore, two PMOS transistor models may exist: a first PMOS model having normal threshold voltage, i.e., a PMOS model that is not affected by the NBTI phenomenon; and a second PMOS model exhibiting increased threshold voltage due to the NBTI phenomenon.

Prior art simulation methods have incorporated a manual process, whereby the circuit designer first identifies those PMOS transistors in the simulation netlist that are in a conductive state. Next, the circuit designer manually replaces all conductive PMOS transistor models with PMOS transistor models exhibiting increased threshold voltage due to the NBTI phenomenon. Finally, the circuit designer executes the simulation on the manually modified simulation netlist.

Such a manual simulation process may be plausible for relatively small netlists. However, the manual simulation process quickly becomes unmanageable and cumbersome for larger netlists. What is needed then, is an automated technique to simulate the affect of the NBTI phenomenon on deep, sub-100 nm circuits using existing simulation technologies.

SUMMARY

To overcome limitations in the prior art, and to overcome other limitations that will become apparent upon reading and understanding the present specification, various embodiments of the present invention disclose an apparatus and method for simulation of negative bias and temperature instability (NBTI) effect on deep, sub-100 nm circuits.

In accordance with one embodiment of the invention, a method of circuit simulation comprises identifying a set of devices within a simulation netlist having a first conductivity type, automatically replacing a simulation model of the set of devices with a modified simulation model, programming a first portion of the set of devices to exhibit a negative bias and temperature instability (NBTI) effect, executing a first simulation cycle, programming a second portion of the set of devices to exhibit the NBTI effect, and executing a second simulation cycle.

In accordance with another embodiment of the invention, a method of circuit simulation comprises identifying a first set of transistors within a simulation netlist having a first conductivity type that are transitioning from a first conductivity state to a second conductivity state in response to a first half simulation cycle, programming the first set of transistors to exhibit a negative bias and temperature instability (NBTI) effect, executing the first half simulation cycle, identifying a second set of transistors within the simulation netlist having the first conductivity type that are transitioning from the first conductivity state to the second conductivity state in response to a second half simulation cycle, programming the second set of transistors to exhibit the NBTI effect, and executing the second half simulation cycle.

In accordance with another embodiment of the invention, a circuit simulation system comprises a processor that is adapted to simulate negative bias and temperature instability (NBTI) effects. The processor is adapted to perform functions including, identifying devices affected by NBTI within a simulation netlist, replacing the identified devices within the simulation netlist with one of a plurality of NBTI device models, and executing one or more simulation cycles on the modified simulation netlist.

BRIEF DESCRIPTION OF THE DRAWINGS

Various aspects and advantages of the invention will become apparent upon review of the following detailed description and upon reference to the drawings in which.

DETAILED DESCRIPTION

Figure 1:
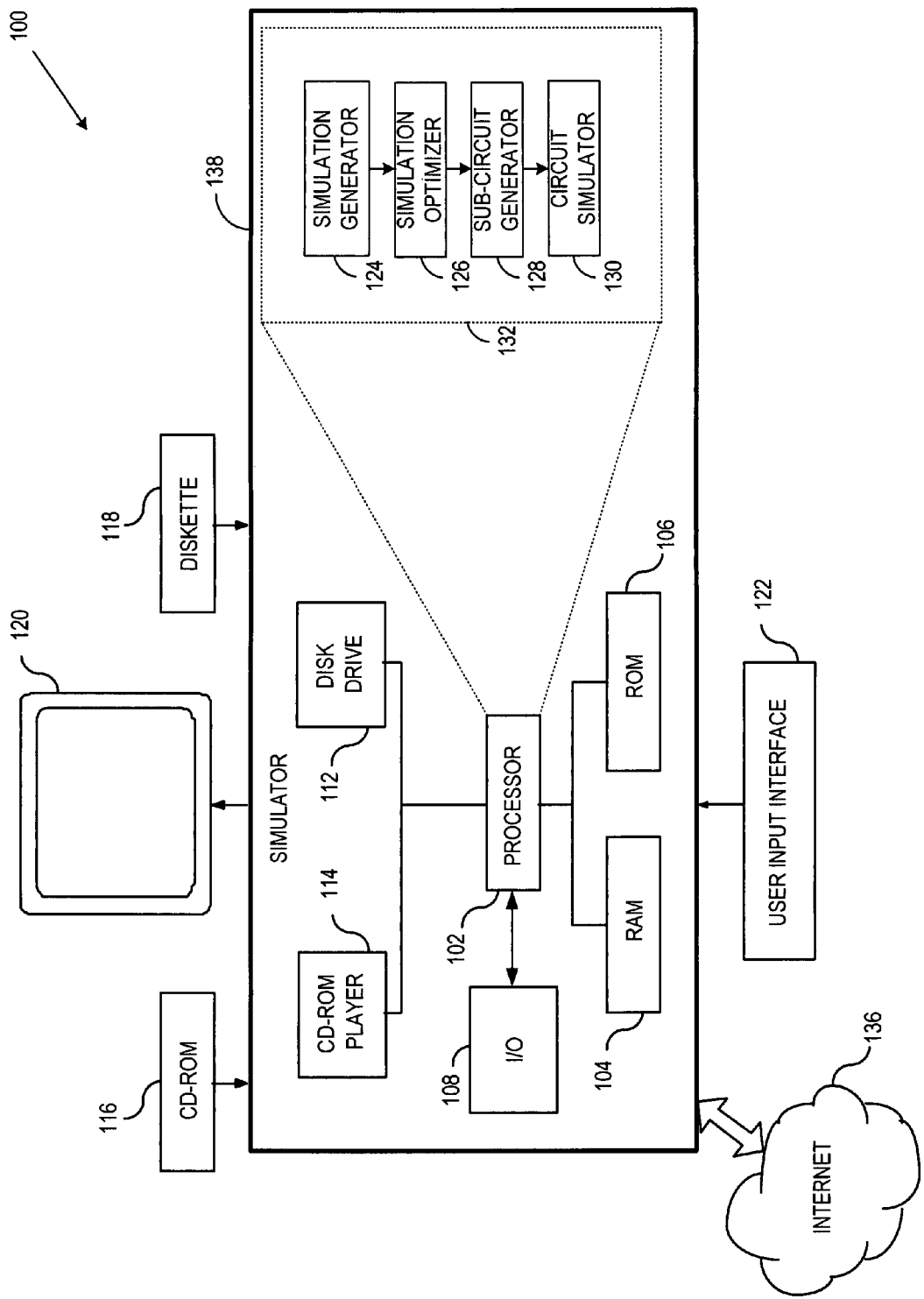
FIG. 1 illustrates an exemplary simulation workstation in accordance with an embodiment of the present invention.

Generally, various embodiments of the present invention provide an apparatus and method to accurately simulate negative bias and temperature instability (NBTI) and its effect on circuits that implement devices affected by NBTI, e.g., P-type metal oxide semiconductor field effect transistors (PMOS-FETs). In particular, PMOSFETs have been shown to be affected by the NBTI phenomenon, to the exclusion of their N-type metal oxide semiconductor field effect transistor (NMOSFET) counterparts, since interface states and fixed charges of the NMOSFET inversion channel are of opposite polarity and eventually cancel each other.

In a first simulation method, i.e., the static simulation method, the simulation netlist is automatically scanned for any PMOS devices that are in a conductive state at time, e.g., t=0. It is assumed that any such PMOS devices have been conductive for a continuous amount of time and, therefore, are affected by the NBTI phenomenon. As such, the conductive PMOS devices are automatically modeled as NBTI PMOS devices, i.e., PMOS devices exhibiting NBTI affects, just prior to executing a first transition of the simulation clock.

After the first transition, some, or all, of the NBTI PMOS devices transition from a conductive state to a non-conductive state. Upon the second transition of the simulation clock, some, or all, of the NBTI PMOS devices will return to a conductive state. As discussed in more detail below, those NBTI PMOS devices returning to the conductive state exhibit worst case NBTI induced delay and, therefore, are of particular interest during simulation. Of similar importance, however, are those NBTI PMOS devices that switch from a conductive state to a non-conductive state. In such instances, transitions are actually accelerated due to the NBTI phenomenon and thus become important when race conditions may affect circuit performance.

In an alternate simulation method, i.e., the dynamic simulation method, any PMOS devices that are in a non-conductive state are automatically modeled as NBTI PMOS devices prior to any simulation clock transition. Once the simulation transition occurs, the NBTI PMOS devices are automatically remodeled as non-NBTI PMOS devices to prepare for the subsequent transition from the conductive state to the non-conductive state. In such an instance, only those PMOS devices transitioning from a non-conductive state to a conductive state are modeled as NBTI PMOS devices, so as to simulate a worst-case delay scenario.

As discussed in more detail below, it is noted that both the static and dynamic simulation methods utilize a combination of currently known simulation elements, such as voltage controlled voltage sources (VCVSs), to generate the NBTI PMOS models. As such, both the static and dynamic simulation methods utilize existing simulation tools to allow circuit designers to optimize their circuits by allowing simulation of the NBTI phenomenon without adding new functionality to existing simulation workstations.

Turning to FIG. 1, an exemplary simulation workstation 100 is illustrated, which may be used to generate the circuit definition files, NBTI PMOS models, and circuit simulation algorithms, as necessary to simulate the NBTI phenomenon and its effect on circuit performance. The exemplary simulation workstation includes simulator 138, which includes a central processor (CPU) 102 that is coupled to random access memory (RAM) 104 and read-only memory (ROM) 106. The ROM 106 may also include other types of storage media to store programs, such as programmable ROM (PROM), electronically erasable PROM (EEPROM), etc. The processor 102 may also communicate with other internal and external components through input/output (I/O) circuitry 108.

Simulator 138 may also include one or more data storage devices, including hard and floppy disk drives 112, CD-ROM drives 114, and other hardware capable of reading and/or storing information such as DVDs, tape drives, etc. Software for facilitating NBTI PMOS modeling, circuit definition files, and circuit simulations may be stored and distributed on a CD-ROM 116, diskette 118 or other forms of media capable of portably storing information. These storage media may be inserted into, and read by, devices such as the CD-ROM drive 114, the disk drive 112, etc.

The software for facilitating the circuit definition files, NBTI PMOS models, and circuit simulation algorithms may also be transmitted to simulator 138 via data signals that are downloaded electronically via a network, such as Internet 136. Simulator 138 is coupled to a display 120, which may be any type of known display or presentation screen, such as LCD displays, plasma display, cathode ray tubes (CRT), etc. A user input interface 122 is provided, including one or more user interface mechanisms such as a mouse, keyboard, microphone, touch pad, touch screen, voice-recognition system, etc.

Processor 102 may be used to execute simulation tools 132 to aid in simulation operations. Simulation generator 124, for example, generates the baseline simulation files that correspond to particular simulation models, including NBTI PMOS device models. Simulation optimizer 126 receives the simulation files from simulation generator 124 and optionally performs reduction methods to optimize the simulation files. Sub-circuit generator 128 then receives the optimized simulation files and generates the circuit definition files that are required by circuit simulator 130 to characterize the sub-circuit's operation.

Figure 2A:
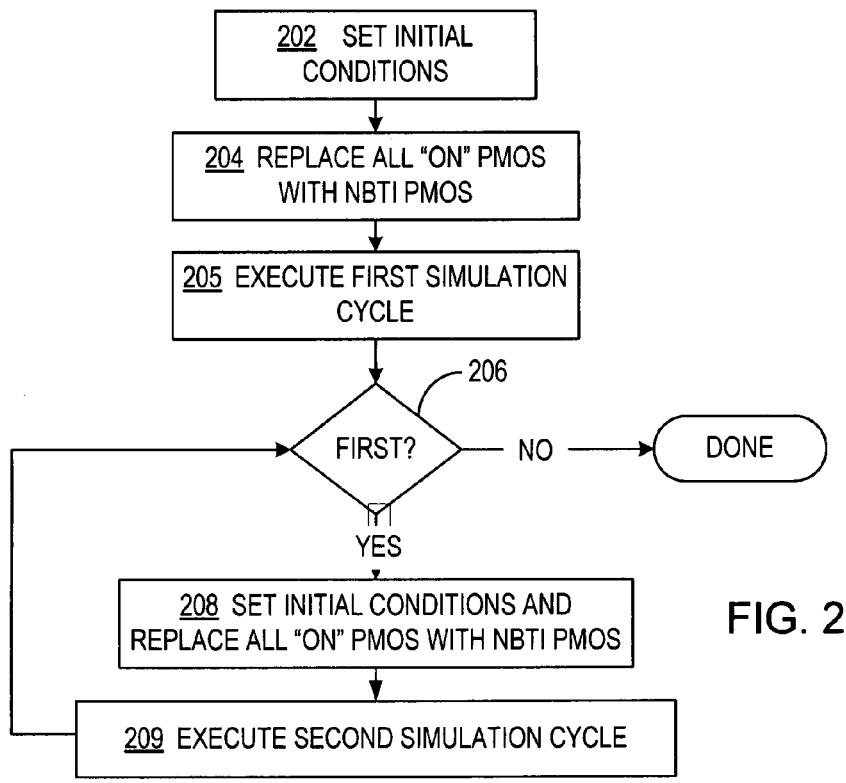
FIG. 2A illustrates an exemplary flow diagram of a method to simulate negative bias and temperature instability (NBTI) effects in accordance with an embodiment of the present invention.
Figure 2B:
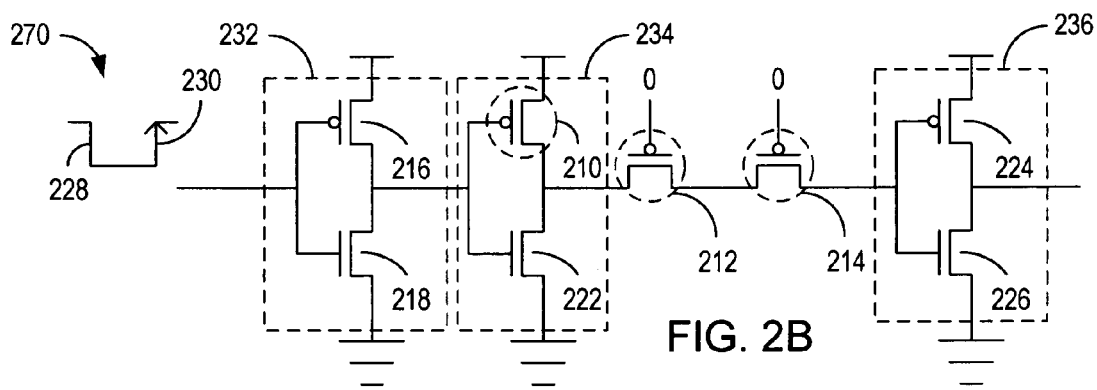
FIGS. 2B-2C illustrates exemplary circuits that may be simulated in accordance with the method of FIG. 2A in accordance with an embodiment of the present invention.
Figure 2C:
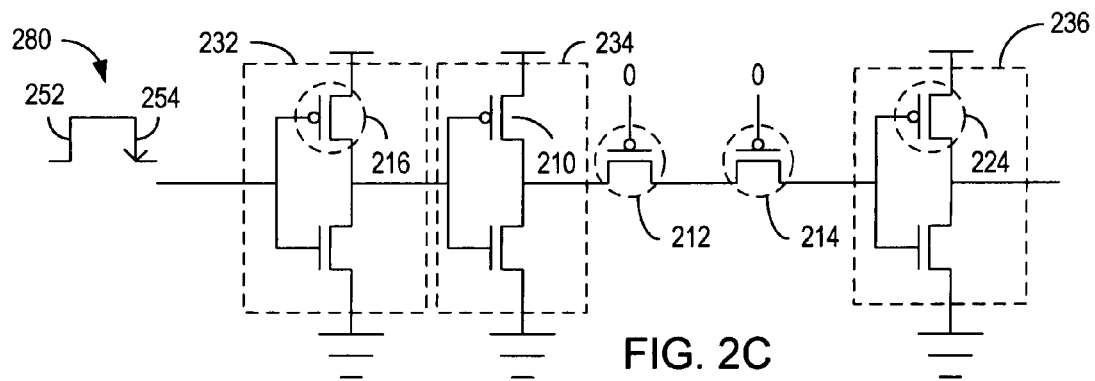

Turning to FIG. 2A, an exemplary flow diagram of a static simulation method is illustrated, which is explained in relation to the exemplary circuits of FIGS. 2B and 2C. In step 202, initial conditions for the circuit are set, whereby in one embodiment, the input to inverter 232 may be set to a logic high level. Accordingly, the input to inverter 234 is set to a logic low level and the input to inverter 236 is set to a logic high level. Pass transistors 212 and 214 are set to their respective conductive states.

In step 204, each PMOSFET rendered conductive by the initial conditions is automatically replaced with a PMOS model that is affected by the NBTI phenomenon. Each PMOSFET affected by the NBTI phenomenon is said to be automatically replaced with an NBTI PMOS model because no manual interaction with the simulation algorithm is necessary. In other words, simulation tools 132 of FIG. 1 may be manipulated by processor 102 to automatically replace PMOSFET devices within the simulation netlist with the appropriate device model as required, and no interaction by the simulation operator is necessary.

Since the inputs to inverters 232 and 236 are at a logic high level, PMOSFETs 216 and 224 are rendered non-conductive, and are thus modeled as PMOS devices that are not affected by the NBTI phenomenon. Since the input to inverter 234 is at a logic low level, on the other hand, PMOSFET 210 is rendered conductive, and is thus modeled as an NBTI PMOS device as indicated by the dotted circle surrounding PMOSFET 210 as illustrated in FIG. 2B. Pass gates 212 and 214 are each rendered conductive as well, and are similarly modeled as NBTI PMOS devices as indicated by the dotted circle surrounding PMOSFETs 212 and 214. NMOSFETs 218, 222, and 226, as discussed above, are not affected by the NBTI phenomenon and thus are modeled as typical NMOS devices.

Thus, the circuit of FIG. 2B is representative of the circuit that is to be simulated during the first simulation cycle of the static simulation method. The simulation is then allowed to progress from the initial condition through two transitions as illustrated in signal trace 270 by high-to-low transition 228 and low-to-high transition 230. During high-to-low transition 228, PMOSFET 210 transitions from a conductive state to a non-conductive state. The drain to source current conducted by PMOSFET 210 is reduced by the NBTI effect, which decreases the delay through inverter 234 during high-to-low transition 228.

During low-to-high transition 230, PMOSFET 210 transitions from a non-conductive state back to its originally conductive state. Due to the reduced drain to source current conducted by NBTI affected PMOSFET 210, however, inverter 234 exhibits a worst case delay during low-to-high transition 230. Thus, during the first simulation cycle of step 204, the performance of inverter 234 is evaluated both in its minimum delay configuration during high-to-low transition 228 and in its worst case delay configuration during low-to-high transition 230.

If the current simulation cycle is the first simulation cycle, as determined in step 206, then the static simulation continues as in step 208. In particular, the initial condition of step 202 is reversed and then each PMOSFET rendered conductive by the reversed initial condition is replaced with a PMOS model that is affected by the NBTI phenomenon. Since the inputs to inverters 232 and 236 are at a logic low level, PMOSFETs 216 and 224 are rendered conductive and are thus modeled as NBTI PMOS devices as indicated by the dotted circle surrounding PMOSFETs 216 and 224 as illustrated in FIG. 2C. Since the input to inverter 234 is at a logic high level, on the other hand, PMOSFET 210 is rendered non-conductive, and is thus modeled as a PMOS device that is not affected by the NBTI phenomenon. Pass gates 212 and 214 are each rendered conductive as well, and are similarly modeled as NBTI PMOS devices as indicated by the dotted circle surrounding PMOSFETs 212 and 214.

Thus, the circuit of FIG. 2C is representative of the circuit that is to be simulated during the second simulation cycle of the static simulation method. The simulation is then allowed to progress from the reversed initial condition through two transitions as illustrated in signal trace 280 by low-to-high transition 252 and high-to-low transition 254. During low-to-high transition 252, PMOSFETs 216 and 224 transition from a conductive state to a non-conductive state. The drain to source current conducted by PMOSFETs 216 and 224 is reduced by the NBTI phenomenon, which decreases the delay through inverters 232 and 236 during low-to-high transition 252.

During high-to-low transition 254, on the other hand, PMOSFETs 216 and 224 transition from a non-conductive state to a conductive state. Due to the reduced drain to source current conducted by NBTI affected PMOSFETs 216 and 224, however, inverters 232 and 236 exhibit worst case delay during high-to-low transition 254. Thus, during the second simulation cycle of step 208, the performance of inverters 232 and 236 are evaluated both in their minimum delay configuration during low-to-high transition 252 and in their worst case delay configuration during high-to-low transition 254.

Figure 3A:
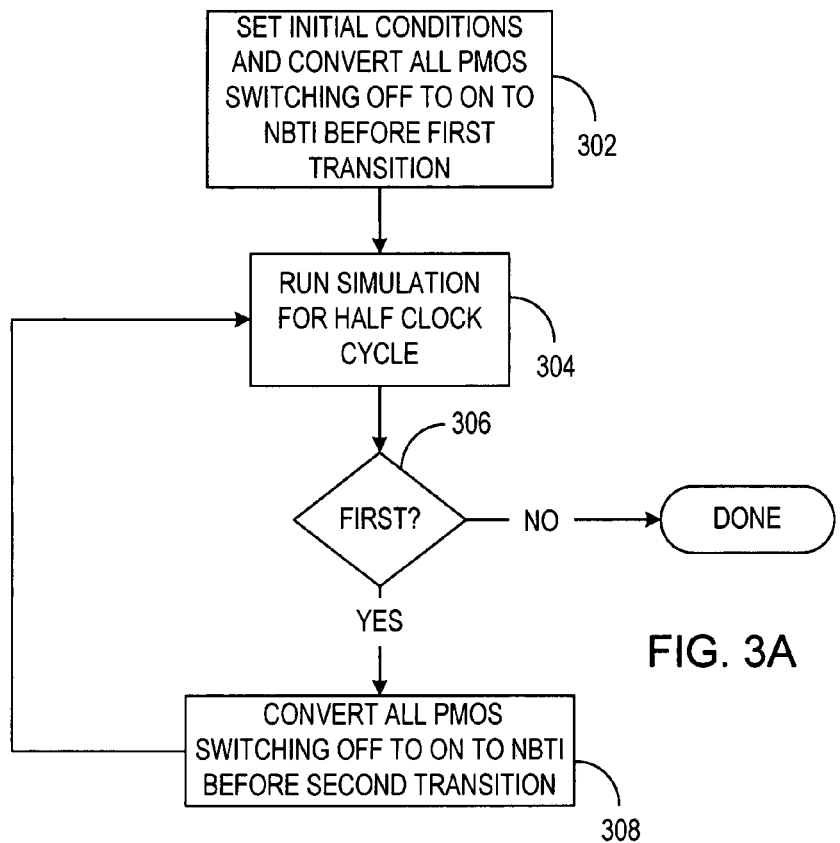
FIG. 3A illustrates an exemplary flow diagram of an alternate method to simulate negative bias and temperature instability (NBTI) effects in accordance with an embodiment of the present invention.

It can be seen, therefore, that the static simulation method of FIG. 2A represents a robust simulation, whereby both decreased delay and increased delay of the NBTI affected devices is characterized. An execution time penalty is incurred, however, since two simulation cycles must be executed. Turning to FIG. 3A, an alternate simulation method is exemplified, whereby worst case NBTI effects may be characterized without incurring the added simulation cycle time.

Figure 3B:
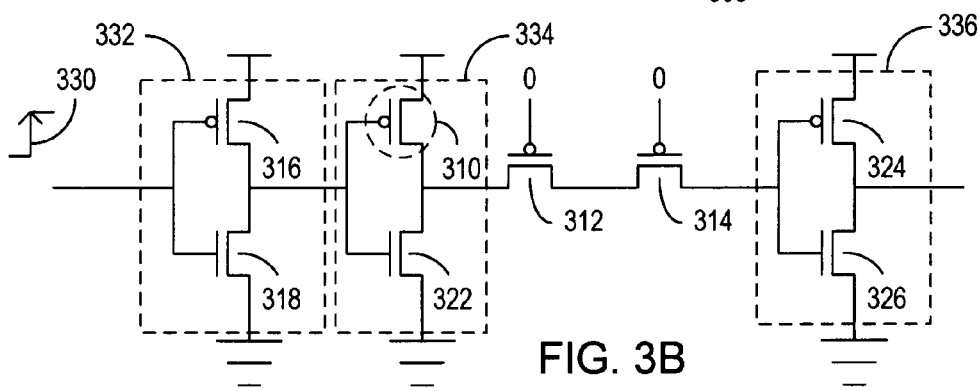
FIGS. 3B-3C illustrates exemplary circuits that may be simulated in accordance with the method of FIG. 3A in accordance with an embodiment of the present invention.
Figure 3C:
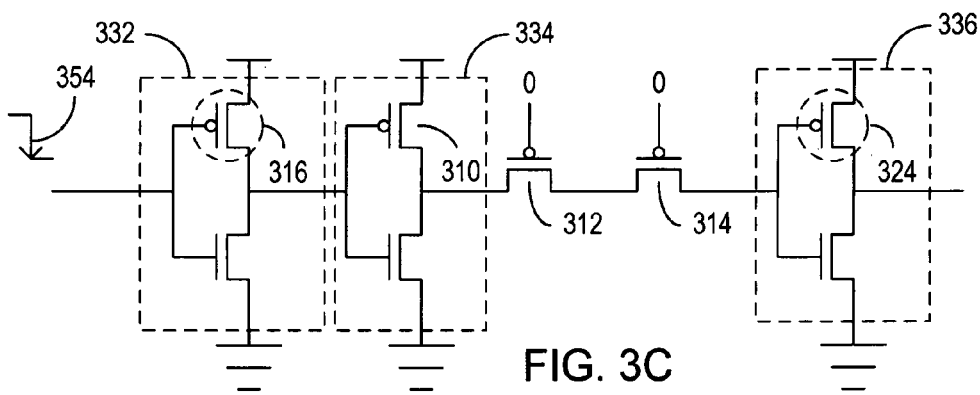

The exemplary flow diagram of a dynamic simulation method is illustrated in FIG. 3A and is explained in relation to the exemplary circuits of FIGS. 3B and 3C. In step 302, initial conditions for the circuit are set, whereby in one embodiment, the input to inverter 332 may be set to a logic low level. Accordingly, the input to inverter 334 is set to a logic high level and the input to inverter 336 is set to a logic low level. Pass transistors 312 and 314 are set to their respective conductive states.

In step 302, each PMOSFET that is rendered non-conductive by the initial conditions, but that will be rendered conductive after the first half cycle of simulation, is automatically replaced with a PMOS model that is affected by the NBTI phenomenon. Each PMOSFET is said to be automatically replaced with an NBTI PMOS model because no manual interaction with the simulation algorithm is necessary. In other words, simulation tools 132 of FIG. 1 may be manipulated by processor 102 to automatically replace PMOSFET devices within the simulation netlist with the appropriate device model as required, and no interaction by the simulation operator is necessary.

Thus, it is assumed that all non-conductive PMOS devices have previously been in a conductive state for a long period of time, e.g., 10 years, and are, therefore, affected by the NBTI phenomenon. All other conductive PMOS devices are modeled as PMOS devices that are not affected by the NBTI phenomenon, since they will transition from a conductive state to a non-conductive state after the first half cycle of simulation.

Since the input to inverter 334 is at a logic high level, PMOSFET 310 is rendered non-conductive, and is thus modeled as an NBTI PMOS device, as indicated by the dotted circle surrounding PMOSFET 310 in FIG. 3B, because PMOSFET 310 is set to transition to a conductive state after the first half cycle of the simulation. Since the input to inverters 332 and 336 are at a logic low level, on the other hand, PMOSFETs 316 and 324 are rendered conductive, and are thus modeled as PMOS devices that are not affected by the NBTI phenomenon. Pass gates 212 and 214 are each rendered conductive and thus are similarly modeled as PMOS devices that are not affected by the NBTI phenomenon. NMOSFETs 318, 322, and 326, as discussed above, are not affected by the NBTI phenomenon and thus are modeled as typical NMOS devices.

Thus, the circuit of FIG. 3B is representative of the circuit that is to be simulated during the first half cycle of the dynamic simulation method. The simulation is then allowed to progress through a single transition as illustrated by lowto-high transition 330 of step 304. During low-to-high transition 330, PMOSFET 310 transitions from a non-conductive state to a conductive state. Due to the reduced drain to source current conducted by NBTI affected PMOSFET 310, inverter 334 exhibits a worst case delay during low-to-high transition 330. Thus, during the first half cycle of the dynamic simulation, the performance of inverter 334 is evaluated in its worst case delay configuration during low-to-high transition 330.

If the simulation cycle is in its first half simulation cycle, as determined in step 306, then the dynamic simulation continues as in step 308. In particular, all PMOS transistors that have been rendered non-conductive after the first half cycle of the simulation are automatically modeled as NBTI PMOS devices. All other PMOS transistors are modeled as PMOS devices that are not affected by the NBTI phenomenon.

Since the inputs to inverters 332 and 336 are at a logic high level, PMOSFETs 316 and 324 are rendered non-conductive and are thus modeled as NBTI PMOS devices as indicated by the dotted circle surrounding PMOSFETs 316 and 324 as illustrated in FIG. 3C. Since the input to inverter 334 is at a logic low level, on the other hand, PMOSFET 310 is rendered conductive, and is thus modeled as a PMOS device that is not affected by the NBTI phenomenon. Pass gates 312 and 314 are each rendered conductive as well, and are similarly modeled as PMOS devices that are not affected by the NBTI phenomenon.

Thus, the circuit of FIG. 3C is representative of the circuit that is to be simulated during the second half cycle of the dynamic simulation method. The simulation is then allowed to progress through the second half cycle of the simulation as illustrated by high-to-low transition 354 of step 308. During high-to-low transition 354, PMOSFETs 316 and 324 transition from a non-conductive state to a conductive state. Due to the reduced drain to source current conducted by NBTI affected PMOSFETs 316 and 324, inverters 332 and 336 exhibit worst case delay during high-to-low transition 354. Thus, during the second half cycle of the dynamic simulation method, the performance of inverters 332 and 336 are evaluated in their worst case delay configuration during high-to-low transition 354.

It can be seen, therefore, that the dynamic simulation method, as discussed above in relation to FIGS. 3A-3C, requires half the number of simulation cycles relative to the static simulation method, as discussed above in relation to FIGS. 2A-2C. However, the dynamic simulation method is less robust as compared to the static simulation method, since only maximum delays are characterized in the dynamic simulation method, whereas the static simulation method characterizes both maximum delay and minimum delay.

Figure 4B:
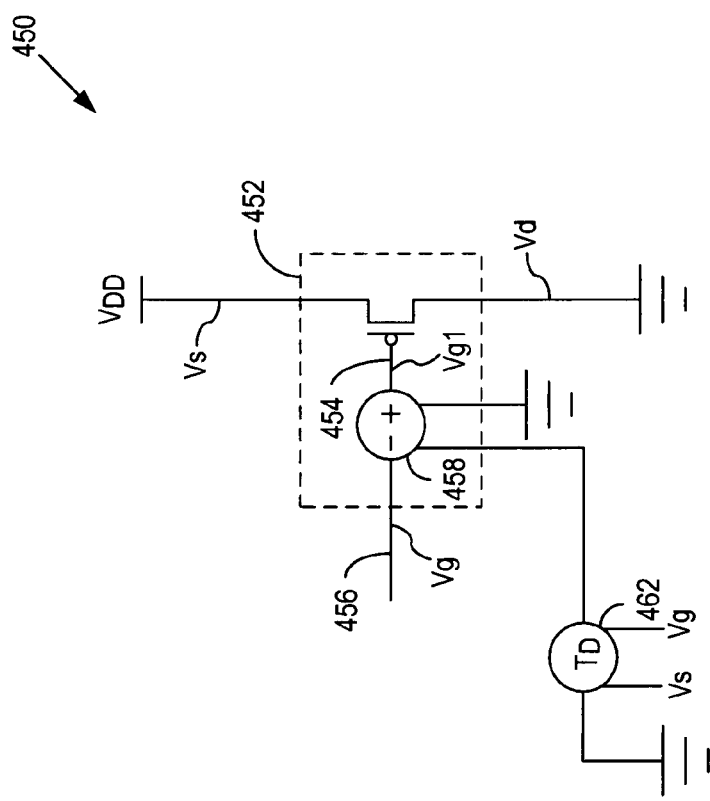
FIG. 4B illustrates an exemplary model of a PMOSFET that may be used during the simulation of the circuits of FIGS. 2B-2C in accordance with an embodiment of the present invention.
Figure 4A:
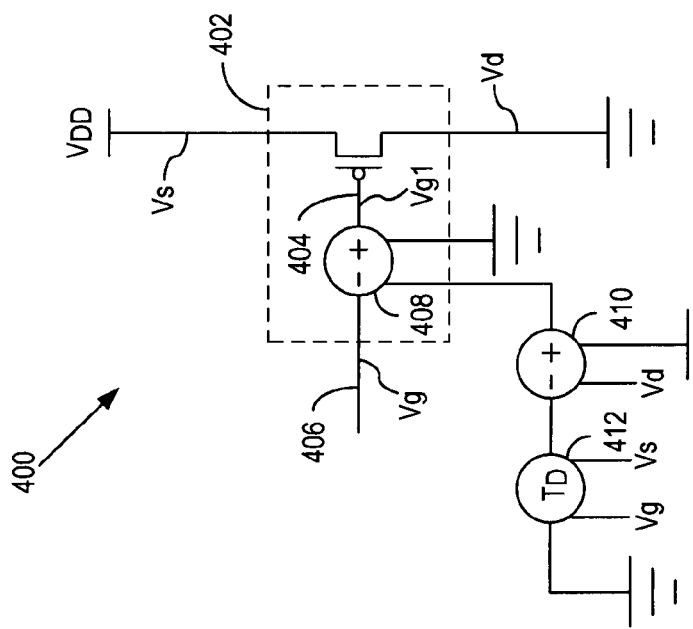
FIG. 4A illustrates an exemplary model of a P-type metal oxide semiconductor field effect transistor (PMOSFET) that may be used during the simulation of the circuits of FIGS. 3B-3C in accordance with an embodiment of the present invention.

Turning to FIG. 4A, an exemplary schematic diagram of NBTI PMOSFET model 400 is illustrated, which may be utilized during the dynamic simulation method as discussed above in relation to FIGS. 3A-3C. Through activation/deactivation of voltage controlled voltage sources (VCVSS) 408-412, the appropriate increase/decrease in threshold voltage, $V_T$, of PMOS device 402 may be simulated. In particular, a $V_T$ increase may be simulated by an appropriate increase in voltage, Vg, at node 406. Alternately, a $V_T$ decrease may be simulated by an appropriate decrease in voltage, Vg, at node 406.

The following voltage equation may be verified for operation of NBTI PMOSFET model 400:

$$Vg1 = Vg + (Vgs + Vdd)*X, \qquad (1)$$

where Vg1 is the voltage at node 404, Vg is the voltage at node 406, Vgs is the voltage generated by VCVS 412, Vdd is the voltage generated by VCVS 410, and X is a multiplier used by VCVS 408 to scale the $V_T$ increase appropriately, depending upon the PMOS device being modeled. For example, the $V_T$ shift due to the NBTI phenomenon for a core PMOS device operating at, e.g., 1 volt, may be equal to, for example, 80 mV, while the $V_T$ shift due to the NBTI phenomenon for an input/output (I/O) PMOS device operating at, e.g., 3.3 volts, may be equal to, for example, 200 mV.

In operation, the gate to source voltage, Vgs, of a particular PMOSFET device within the simulation netlist is measured. Should Vgs be measured to be equal −Vdd, for example, then the PMOS device is in a conductive state. In such an instance, Vg1=Vg in accordance with equation (1), whereby no increase in $V_T$ is simulated. Thus, all conductive PMOS devices are not modeled as being affected by the NBTI phenomenon, i.e., their threshold voltage is not increased, as discussed above in relation to the dynamic simulation method of FIGS. 3A-3C, and equation (1) is verified.

After a programmable time delay, $T_D$, VCVS 412 is programmed to a voltage of 0 volts, where Vg1=Vg+Vdd*X in accordance with equation (1). In such an instance, each PMOS device modeled using NBTI PMOS model 400 is automatically converted from a PMOS device exhibiting no NBTI effect to a PMOS device that is affected by the NBTI phenomenon after time delay, $T_D$. Thus, after the first half cycle of the dynamic simulation method, each PMOS device is automatically converted to the correct PMOS device type in preparation for the second half cycle.

Turning to FIG. 4B, an exemplary schematic diagram of NBTI PMOSFET model 450 is illustrated, which may be utilized during the static simulation method as discussed above in relation to FIGS. 2A-2C. Through activation/deactivation of voltage controlled voltage sources (VCVSs) 458 and 462, the appropriate increase/decrease in threshold voltage, $V_T$, of PMOS device 452 may be simulated. In particular, a $V_T$ increase may be simulated by an appropriate increase in voltage, Vg, at node 456. Alternately, a $V_T$ decrease may be simulated by an appropriate decrease in voltage, Vg, at node 456.

The following voltage equation may be verified for operation of NBTI PMOSFET model 450:

$$Vg1 = Vg + Vsg*X, \qquad (2)$$

where Vg1 is the voltage at node 454, Vg is the voltage at node 456, Vsg is the voltage generated by VCVS 462, and X is a multiplier used by VCVS 458 to scale the $V_T$ increase appropriately, depending upon the PMOS device being modeled.

In operation, the source to gate voltage, Vsg, of a particular PMOSFET device within the simulation netlist is measured. Should Vsg be measured to be equal +Vdd, for example, then the PMOS device is in a conductive state. In such an instance, Vg1=Vg+Vdd*X in accordance with equation (2), whereby an increase in $V_T$ is simulated. Thus, all conductive PMOS devices are modeled as being affected by the NBTI phenomenon, i.e., their threshold voltage is increased, as discussed above in relation to the static simulation method of FIGS. 2A-2C, and equation (2) is verified.

After a programmable time delay, $T_D$, VCVS 412 is programmed to a voltage of 0 volts, where Vg1=Vg in accordance with equation (2). In such an instance, each PMOS device modeled using NBTI PMOS model 450 is automatically converted from a PMOS device exhibiting the NBTI effect to a PMOS device that is not affected by the NBTI phenomenon after time delay, $T_D$. Thus, after the first full cycle of the static simulation method, each PMOS device is automatically converted to the correct PMOS device type in preparation for the second full cycle of the static simulation method.

Other aspects and embodiments of the present invention will be apparent to those skilled in the art from consideration of the specification and practice of the invention disclosed herein. It is intended that the specification and illustrated embodiments be considered as examples only, with a true scope and spirit of the invention being indicated by the following claims.

What is claimed is:

1. A method of circuit simulation, comprising:
P-type metal oxide semiconductor field effect transistors (PMOSFETs) within a simulation netlist;
automatically replacing a simulation model of the set of PMOSFETs with a modified simulation model;
programming a first portion of the set of PMOSFETs to exhibit a negative bias and temperature instability (NBTI) effect;
executing a first simulation cycle;
programming a second portion of the set of PMOSFETs to exhibit the NBTI effect; and
executing a second simulation cycle; wherein the first and second simulation cycles are performed using a processor.

2. The method of claim 1, further comprising applying a first set of initial conditions to the simulation netlist prior to executing the first simulation cycle.

3. The method of claim 2, wherein programming the first portion of the set of devices comprises identifying PMOSFETs that are conductive in response to the first set of initial conditions.

4. The method of claim 3, wherein programming the first portion of the set of PMOSFETs further comprises programming voltage controlled voltage sources of the identified PMOSFETs to simulate an increase in threshold voltage.

5. The method of claim 1, further comprising applying a second set of initial conditions to the simulation netlist after executing the first simulation cycle.

6. The method of claim 5, wherein programming the second portion of the set of PMOSFETs comprises identifying devices that are conductive in response to the second set of initial conditions.

7. The method of claim 6, wherein programming the second portion of the set of PMOSFETs further comprises programming voltage controlled voltage sources of the identified PMOSFETs to simulate an increase in threshold voltage.

8. The method of claim 1, wherein identifying the set of PMOSFETs within the simulation netlist comprises identifying the first portion of the set of PMOSFETs within the simulation netlist having a conductivity type that are transitioning from a first conductivity state to a second conductivity state in response to the first simulation cycle, wherein the first simulation cycle is a first half cycle of a dynamic simulation technique.

9. The method of claim 1, further comprising, after executing the first simulation cycle, identifying the second portion of the set of PMOSFETs within the simulation netlist having the conductivity type that are transitioning from the first conductivity state to the second conductivity state in response to the second simulation cycle, wherein the second simulation cycle is a second half cycle of the dynamic simulation technique.

10. The method of claim 8, wherein identifying the first portion of the set of PMOSFETs within the simulation netlist having the conductivity type further comprises identifying PMOSFETs that are non-conductive in response to a set of initial conditions and that are transitioning from a non-conductive state to a conductive state in response to the first half cycle of the dynamic simulation technique.

11. The method of claim 9, wherein identifying the second portion of the set of PMOSFETs within the simulation netlist having the conductivity type further comprises identifying PMOSFETs that are non-conductive in response to the execution of the first half cycle of the dynamic simulation technique and that are transition ing from a non-conductive state to a conductive state in response to the second half cycle of the dynamic simulation technique.

* * * * *